(12) United States Patent
Ma (10) Patent No.: US 7,027,853 B2
(45) Date of Patent: Apr. 11, 2006

(54) DATA ACQUISITION METHOD AND APPARATUS FOR MR IMAGING

(75) Inventor: Jingfei Ma, Houston, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 136 days.

(21) Appl. No.: 10/255,210

(22) Filed: Sep. 26, 2002

(65) Prior Publication Data

US 2004/0064032 A1   Apr. 1, 2004

(51) Int. Cl.
*A61B 5/00* (2006.01)

(52) U.S. Cl. ............... 600/410; 600/407; 600/411; 600/587; 128/898; 128/897; 128/920; 128/922; 703/2; 703/3; 703/7; 703/11; 601/2; 601/3; 601/4; 707/102; 707/103; 707/104

(58) Field of Classification Search ........ 600/407–436; 392/128, 130; 324/306, 307, 309
See application file for complete search history.

(56) References Cited

U.S. PATENT DOCUMENTS

| | | | |
|---|---|---|---|
| 5,133,357 A * | 7/1992 | Dumoulin et al. | 600/413 |
| 5,204,627 A * | 4/1993 | Mistretta et al. | 324/309 |
| 5,229,717 A * | 7/1993 | Hinks | 324/309 |
| 5,237,273 A * | 8/1993 | Plewes et al. | 324/309 |
| 5,541,513 A * | 7/1996 | Maier | 324/309 |
| 5,672,969 A * | 9/1997 | Zhou et al. | 324/309 |
| 6,472,872 B1 * | 10/2002 | Jack et al. | 324/309 |
| 6,583,624 B1 * | 6/2003 | Muthupillai et al. | 324/309 |

* cited by examiner

Primary Examiner—Brian L. Casler
(74) Attorney, Agent, or Firm—Fletcher Yoder (57) ABSTRACT

An improved technique is described for acquiring MR image data such as needed for FSE-based Dixon imaging techniques. A gradient-induced echo shift is produced in the pulse sequences by a small gradient applied along the readout axis prior to a readout pulse. When necessary, another small pulse is applied along the readout axis, equal in area and opposite in polarity to the first, to compensate for the shifting effect. Similar pulses are applied for each acquisition window. While data with non-zero phase shifts between water and fat signals are collected as fractional echoes, no increase in echo spacing is necessary with the modified acquisition strategy. Images corresponding to different phase shifts are reconstructed using phase-sensitive partial Fourier reconstruction algorithms whenever necessary. These images are then used to separate different chemical species (such as water and fat) in the object to be imaged. Increased time efficiency is therefore achieved with the improved technique, with a significant reduction in degradation due to losses in slice coverage and increased image blurring and sensitivity to flow and motion due to T2-modulation along the echo train in conventional techniques.

46 Claims, 5 Drawing Sheets

DATA ACQUISITION METHOD AND APPARATUS FOR MR IMAGING

BACKGROUND OF THE INVENTION

The present invention relates generally to the field of magnetic resonance imaging. More particularly, the invention relates to a technique for providing magnetic resonance echo shifting without the need for shifting the radio-frequency pulse, or the data acquisition window, or both, such as for producing water-only or fat-only images, in a highly time efficient manner through a Dixon imaging pulse sequence.

Magnetic resonance imaging (MRI) systems have become ubiquitous in the field of medical diagnostics. Over the two past decades, improved techniques for MRI examinations have been developed that now permit very high-quality images to be produced in a relatively short time. As a result, diagnostic images with varying degrees of resolution are available to the radiologist that can be adapted to particular diagnostic applications.

In general, MRI examinations are based on the interactions among a primary magnetic field, a radiofrequency (rf) magnetic field and time varying magnetic gradient fields with nuclear spins within the subject of interest. Specific nuclear components, such as hydrogen nuclei in water molecules, have characteristic behaviors in response to external magnetic fields. The precession of spins of such nuclear components can be influenced by manipulation of the fields to produce rf signals that can be detected, processed, and used to reconstruct a useful image.

The magnetic fields used to generate images in MRI systems include a highly uniform, static magnetic field that is produced by a primary magnet. A series of gradient fields are produced by a set of three gradient coils disposed around the subject. The gradient fields encode positions of individual volume elements or voxels in three dimensions. An rf coil is employed to produce an rf magnetic field. This rf magnetic field perturbs the spin system from its equilibrium direction, causing the spins to precess around the axis of their equilibrium magnetization. During this precession, rf fields are emitted by the spins and are detected by either the same transmitting rf coil, or by a separate receive-only coil. These signals are amplified, filtered, and digitized. The digitized signals are then processed using one of several possible reconstruction algorithms to reconstruct a useful image.

Many specific techniques have been developed to acquire MR images for a variety of applications. One major difference among these techniques is in the way gradient pulses and rf pulses are used to manipulate the spin systems to yield different image contrasts, signal-to-noise ratios, and resolutions. Graphically, such techniques are illustrated as "pulse sequences" in which the pulses are represented, along with temporal relationships among them. In recent years, pulse sequences have been developed which permit extremely rapid acquisition of large amounts of raw data. Such pulse sequences permit significant reduction in the time required to perform the examinations. Time reductions are particularly important for acquiring high resolution images, as well as for suppressing motion effects and reducing the discomfort of patients in the examination process.

Among the pulse sequences which have been developed for fast acquisition of large amounts of MR data, is a sequence generally referred to as fast spin echo (FSE). This technique is capable of generating high-quality image data in a fraction of the time needed for conventional spin echo imaging. FSE techniques have thus become the sequence of choice, especially for T2-weighted imaging. However, a prominently distinguishing feature of FSE images is an anomalously bright signal resulting from fat content in the tissue being imaged. The phenomenon has been attributed to the demodulation of the J-coupling and de-sensitization of diffusion through inhomogeneities due to the rapidly refocusing rf pulse trains contained in the FSE pulse sequence.

Fat suppression has therefore become desirable in T2-weighted imaging procedures. At present, several techniques have been employed for such fat suppression. A first such technique is referred to as chemical saturation, and can be used to reduce the fat signal, but requires very homogeneous magnetic fields due to the close separation of the water and fat signals resulting from the excitation. In particular, the rf pulse must saturate all fat, requiring a highly uniform main magnetic field, to avoid separating water signals. Similarly, the technique depends highly upon the homogeneity of the rf field which is needed to achieve an accurate flip of the fat signal for suppression and subsequent flip of the resulting water signals for imaging. Inhomogeneity in the main magnetic field is particularly a problem at locations off the isocenter of the field system. Finally, patient anatomy also tends to perturb the fields, rendering the technique particularly problematic.

A second technique that has been developed for fat suppression involves short inversion time (TI) inversion recovery, and is commonly referred to as STIR. This technique is intended to flip all signals to an inverted direction, with fat and water signals recovering at different rates. The technique then acquires the image data when the fat signal is crossing the null point while the water signal is still partially in the inverted state. Because of its underlying principles, the technique typically is dependent on the T1 of the water signal, and generally results in relatively low signal-to-noise ratios due to the partial recovery of the water signal during the recovery of the fat signal.

A further technique that has been developed is generally referred to as the Dixon technique. In this approach, the chemical shift difference between water and fat is encoded into images with different echo shifts. Field inhomogeneity effects appear as image phase errors, which in principle can be corrected for by a combination of multipoint acquisition and more elaborate image processing. While these techniques allow for more uniform water and fat separation in the presence of field inhomogeneity, one clear drawback is the requirement for multiple data acquisitions and therefore longer scan times.

Incorporating the Dixon approach with fat suppression into FSE pulse sequences presents a mutually beneficial combination. While the Dixon technique provides a potentially robust separation of the strong fat signal, FSE helps to alleviate for long data acquisition times in the multipoint Dixon technique. In an exemplary combination of these techniques, however, echo shift as dictated by the Dixon technique was achieved by shifting the timing of the readout gradient and the data acquisition window to maintain necessary conditions (Carr-Purcell-Meiboom-Gill; "CPMG" conditions). As a result, inter-echo spacing was increased, leading to substantial loss in the slice coverage for a given sequence repetition time, largely offsetting the gain of using FSE for reducing the scan time. The technique is believed, therefore, to be appropriate for imaging small anatomic areas only that do not require large slice coverage.

Dixon technique based on the conventional spin echo or gradient echo sequences generally employ shifting the echo through either shifting the RF pulse, or the data acquisition window, or both. As in the case of FSE based Dixon technique, such shifting may lead to the disadvantage of longer acquisition times because of the increased deadtime during a sequence. Consequently, the loss of slice coverage for a given span time, or increased scan time for a given number of slices, and an increase in blurring and greater sensitivity to flow and motion artifacts, can all result.

There is a need, therefore, for an improved technique for obtaining shifts in echos in MR imaging sequences. There is a particular need for a FSE-based Dixon imaging approach which achieves the echo shifts satisfying the CPMG conditions without necessitating an increase in echo spacing. There is, at present, a particular need for an improved technique which can be implemented on existing hardware and control systems to obtain the improvement in timing and imaging clarity in a relatively straightforward manner.

BRIEF DESCRIPTION OF THE INVENTION

The present invention provides an imaging technique designed to respond to such needs. In accordance with one aspect of the technique, a method is provided for acquiring magnetic resonance image data. The method includes a step of, in the presence of a primary and gradient magnetic field system, generating an echo shifting gradient pulse on a readout access. A readout gradient pulse is then generated on the readout axis. Magnetic resonance echo signals are detected that result from the readout gradient, and a compensating gradient pulse is then generated on the readout axis.

In accordance with another aspect of the invention, a method is similarly provided for acquiring magnetic resonance image data that includes, in the presence of a primary and gradient field magnetic field system, applying a Dixon fast spin echo pulse sequence. An echo shifting gradient pulse is generated on a readout axis, and a readout gradient pulse is then generated on the readout axis. Magnetic resonance echo signals resulting from the readout gradient are detected, and a compensating gradient pulse is generated on the readout axis.

In accordance with another aspect of the invention, a method for acquiring magnetic resonance image data includes apply a Dixon fast spin echo pulse sequence to acquire a plurality of k-space lines of data in the presence of a primary and gradient magnetic field system. For each k-space line of data, an echo shifting gradient pulse of a first polarity and of a desired area is generated on a readout axis. A readout gradient pulse is generated on the readout axis as well, and magnetic resonance echo signals resulting from the readout gradient are detected. Finally, compensating gradient pulses are generated of a second polarity opposite to the first polarity and of the desired area on the readout axis.

In accordance with the further aspect of the invention, a method for acquiring magnetic resonance image data includes applying a Dixon fast spin echo pulse sequence to acquire a plurality of k-space lines of data in the presence of a primary and gradient magnetic field system. For each k-space line of data, an echo shifting gradient pulse of a first polarity and of a desired area is generated on a readout axis, and a readout gradient pulse is generated on the readout axis. Magnetic resonance echo signals resulting from the readout gradient are detected, and a compensating gradient pulse of a second polarity opposite to the first polarity, and of the desired area is generated on a readout axis. An image is then reconstructed based upon the detected echo signals.

DETAILED DESCRIPTION OF SPECIFIC EMBODIMENTS

Figure 1:
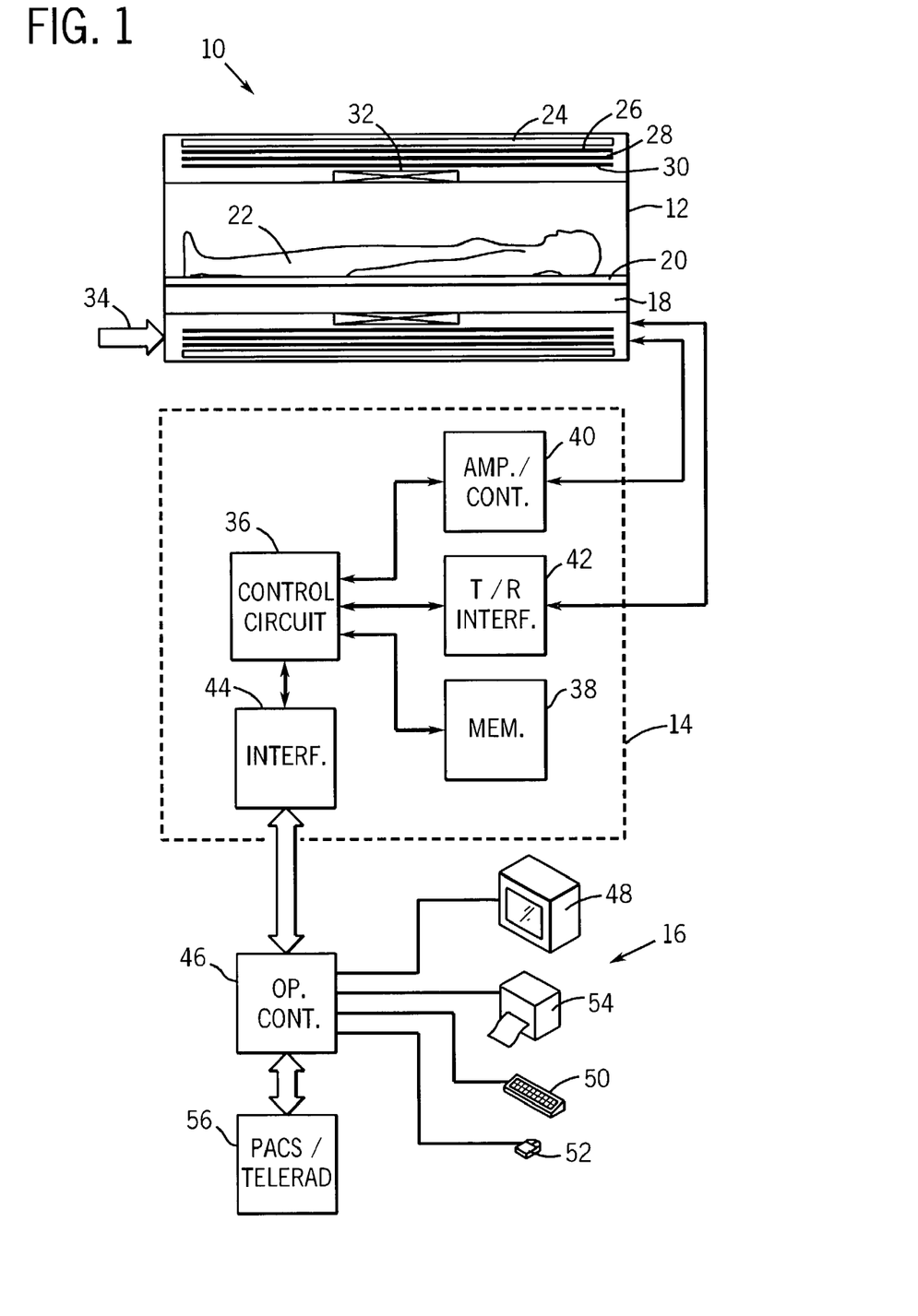
FIG. 1 is a diagrammatical representation of an MRI system for use in medical diagnostic imaging and implementing certain aspects of the present shielding technique.

Turning now to the drawings, and referring first to FIG. 1, a magnetic resonance imaging (MRI) system 10 is illustrated diagrammatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radiofrequency rf excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. An rf coil 32 is provided for generating rf pulses for exciting the gyromagnetic material. Power is supplied to scanner 12 in any appropriate manner, as indicated generally at reference numeral 34. In the embodiment illustrated in FIG. 1, coil 32 also serves as a receiving coil. Thus, rf coil 32 may be coupled with driving and receiving circuitry in passive and active modes for receiving emissions from the gyromagnetic material and for applying rf excitation pulses, respectively. Alternatively, various configurations of receiving coils may be provided separate from rf coil 32. Such coils may include structures specifically adapted for target anatomies, such as head coil assemblies, and so forth. Moreover, receiving coils may be provided in any suitable physical configuration, including phased array coils, and so forth. As described more fully below, the present technique provides for improved image acquisition sequences which enhance image quality, particularly in the separation of signals from differing materials, such as water and fat, without significant lengthening in image data acquisition times.

In a present configuration, the gradient coils 26, 28 and 30 have different physical configurations adapted to their function in the imaging system 10. As will be appreciated by those skilled in the art, the coils are comprised of conductive wires, bars or plates which are wound or cut to form a coil structure which generates a gradient field upon application of control pulses as described below. The placement of the coils within the gradient coil assembly may be done in several different orders, but in the present embodiment, a Z-axis coil is positioned at an innermost location, and is formed generally as a solenoid-like structure which has relatively little impact on the rf magnetic field. Thus, in the illustrated embodiment, gradient coil 30 is the Z-axis solenoid coil, while coils 26 and 28 are Y-axis and X-axis coils respectively.

The coils of scanner 12 are controlled by external circuitry to generate desired fields and pulses, and to read signals from the gyromagnetic material in a controlled manner. As will be appreciated by those skilled in the art, when the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, an rf frequency pulse is generated at or near the Larmor frequency of the material of interest, resulting in rotation of the net aligned moment to produce a net transverse magnetic moment. This transverse magnetic moment precesses around the main magnetic field direction, emitting rf signals that are detected by the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a desirably linear variation in the Z-axis component of the magnetic field strength across the field of view. The field varies linearly in one direction, but is homogenous in the other two. The three coils have mutually orthogonal axes for the direction of their variation, enabling a linear field gradient to be imposed in an arbitrary direction with an appropriate combination of the three gradient coils.

The pulsed gradient fields perform various functions integral to the imaging process. Some of these functions are slice selection, frequency encoding and phase encoding. These functions can be applied along the X-, Y- and Z-axis of the original coordinate system or along other axes determined by combinations of pulsed currents applied to the individual field coils.

The slice select gradient determines a slab of tissue or anatomy to be imaged in the patient. The slice select gradient field may be applied simultaneously with a frequency selective rf pulse to excite a known volume of spins within a desired slice that precess at the same frequency. The slice thickness is determined by the bandwidth of the rf pulse and the gradient strength across the field of view.

The frequency encoding gradient is also known as the readout gradient, and is usually applied in a direction perpendicular to the slice select gradient. In general, the frequency encoding gradient is applied before and during the formation of the MR echo signal resulting from the rf excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

As will be appreciated by those skilled in the art, a great number of variations may be devised for pulse sequences employing the exemplary gradient pulse functions described above, as well as other gradient pulse functions not explicitly described here. Moreover, adaptations in the pulse sequences may be made to appropriately orient both the selected slice and the frequency and phase encoding to excite the desired material and to acquire resulting MR signals for processing.

The coils of scanner 12 are controlled by scanner control circuitry 14 to generate the desired magnetic field and radiofrequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving rf coil 32. Moreover, where the rf coil serves both to emit the rf excitation pulses and to receive MR signals, circuitry 42 will typically include a switching device for toggling the rf coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a horizontal cylindrical bore imaging system employing a superconducting primary field magnet assembly, the present technique may be applied to various other configurations, such as scanners employing vertical fields generated by superconducting magnets, permanent magnets, electromagnets or combinations of these means.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a monitor 48, a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Particular pulse sequence descriptions have been developed for implementation on MRI systems of the type illustrated in FIG. 1 which permit acquisition of large amounts of data in relatively short time periods to produce high-quality reconstructed images. One such technique is known as fast spin echo (FSE) imaging. In the FSE technique, based upon techniques known as relaxation enhancement (RARE) and spin echo (SE) imaging, data representative of all MR signal echoes needed for image reconstruction are not collected in a single shot. Instead, multiple echo signal data sets are collected, typically in excess of 16, each encoded at a different phase level. The data is collected at each relaxation time interval, with refocusing pulses being applied by the rf coil at repeated integrals. A major benefit in FSE and similar imaging techniques is a great reduction in the overall time required for signal acquisition.

Figure 2:
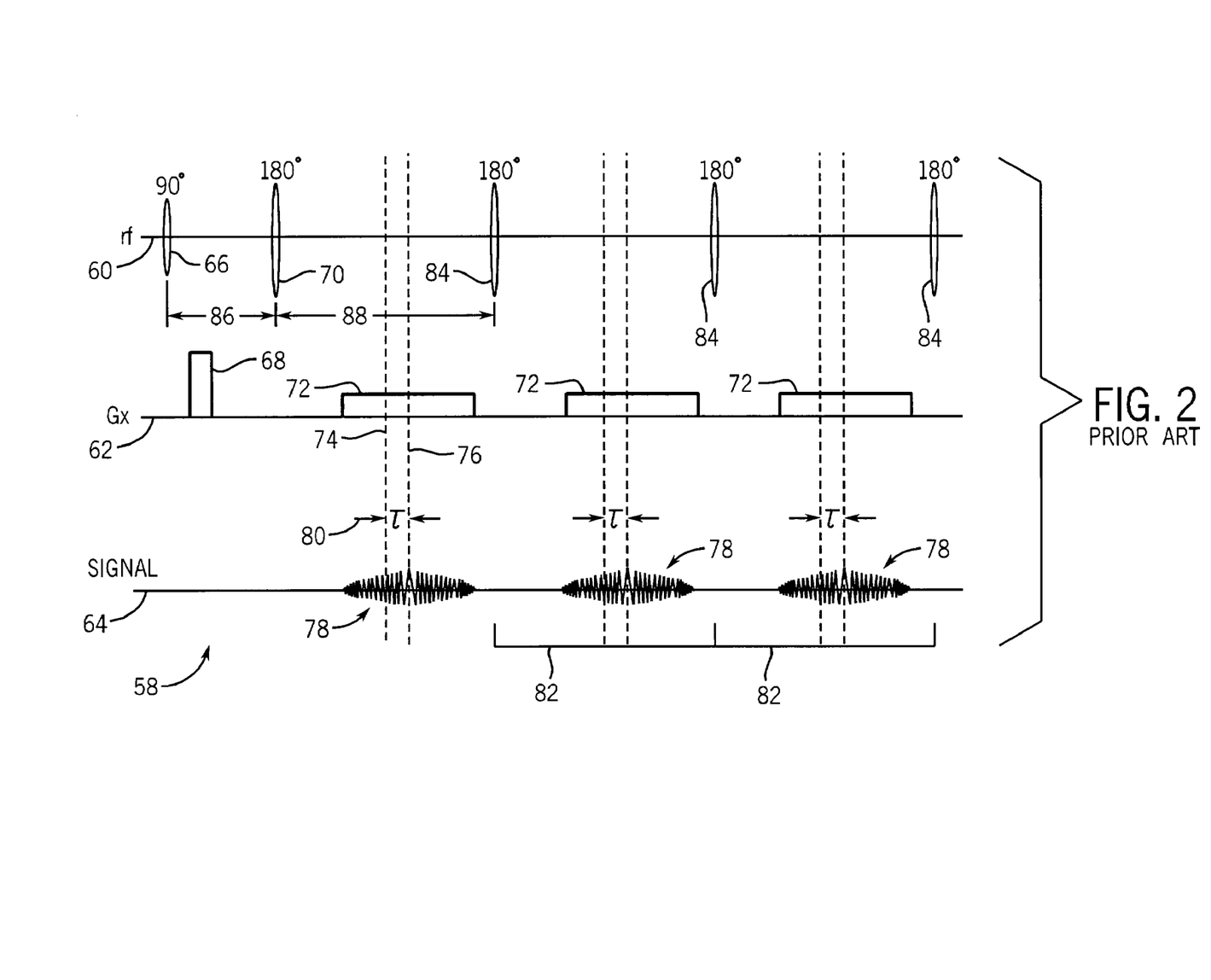
FIG. 2 is diagrammatical representation of a pulse sequence description for a conventional Dixon fast spin echo MRI sequence, particularly illustrating time delays required for the Dixon technique.

In order to achieve better fat suppression in the presence of main and/or RF field inhomogeneities, a technique commonly referred to as the Dixon method obtains echo shifts (shifts in the time of occurrence of the MR echo signal) by time shifting the refocusing rf pulse. Alternatively, similar shifts can be achieved by shifting the data acquisition window and the readout gradient while keeping the timing of the refocusing pulse fixed. The amount of the time shift in either cases is directly proportional to the desired phase shift between different paramagnetic species intended to be separated for image reconstruction. As noted above, it is particularly useful to separate water and fat magnetizations in imaging sequences so as to more clearly represent anatomical features of interest. FIG. 2 represents an exemplary FSE implementation of the Dixon technique using the latter approach of shifting the readout gradient and the data acquisition window of this type.

As shown in FIG. 2, the pulse sequence description, referred to generally by reference numeral 58, may be represented diagrammatically as a series of pulses applied on logical axis of the MRI system. As will be appreciated by those skilled in the art, the logical axis corresponds to activities imposed on the various system components, particularly the gradient and rf coils. In practice, the pulses indicated the present discussion as being applied to a readout axis may, of course, be applied to one or multiple physical axes defined by the gradient coils. Similarly, other conventional pulses will be included in the pulse sequences and applied to the gradient coils for phase and frequency encoding.

In the diagrammatical representation of FIG. 2, the pulse sequence 58 is illustrated on three logical axes, the rf axis 60, the readout gradient axis 62, and the MR signal or data acquisition axis 64. In the illustration of FIG. 2, a first 90° excitation pulse 66 is applied to the rf axis, followed by a dephaser pulse 68 applied on the readout axis 62. Following a predetermined time period, a 180° refocus pulse 70 is applied to the rf axis 60. Thereafter, a readout pulse 72 is applied along the readout axis 62, to collect signal data for an MR echo 78 occurring as indicated along data acquisition axis 64. The pulses result in different-echo times as indicated by lines 74 and 76, respectively, in FIG. 2. These echo times correspond to echoes with different phase shifts from the different constituents for which image data is desired, such as water and fat. A time delay 80 is thereby introduced by the shift which recurs for each repetition of data acquisition. In conventional Dixon FSE imaging, the refocus and acquisition pulses are carried out repeatedly as indicated by reference numeral 82 in FIG. 2, wherein successive refocusing pulses 84 are applied to acquire successive MRI echo signal data, with different phase encoding for each successive repetition. The number of repetitions will generally depend upon the desired image resolution along the phase encode direction.

In the conventional FSE pulse sequence, the interecho spacing is kept to a minimum that allows the playout of all the gradient and RF pulses without conflicting pulse overlap. Increased interecho spacing generally results in increased total scan time for a given number of slices, or reduced number of slices within a given total scan time. In addition, the increased intercho spacing also leads to a detrimental effect of increased image blurring and increased sensitivity to flow and motion. For the FSE implementation of the Dixon technique illustrated in FIG. 2, the inter-echo spacing must be twice the time period 86 between the 90° excitation pulse 66 and the 180° refocus pulse 70 in order to satisfy the Carr-Purcell-Meiboom-Gill (CPMG) condition. Moreover, in order to generate a phase shift between water and fat magnetizations, a time shift 80 is needed, as mentioned above. It has been found, for example, that in a 1.5 Tesla MRI system, a time 80 required to achieve a phase angle difference of 180° is approximately 2.3 ms. Because the inter-echo spacing must be twice this value, however, a 4.6 ms increase in the echo spacing is required to achieve the desired 180° phase shift between water and fat signals at the 1.5 Tesla field strength. These considerations result in substantial lengthening of the interecho spacing and therefore total data acquisition period. Considering, for example, a typical 8 ms total readout time when using 256 readout points at 16 kHz receiver bandwidth, such an increase amounts to a significant lengthening of the sequence time and in parts increased image blurring due to the signal T2-modulation within the echo train. More importantly, the increase in echo spacing leads to a substantial protocol-dependent reduction, sometimes as much as 30%–40%, in the slice coverage for a given imaging time. Again, considering only the issue of the time lengthening, the echo train length is increased by twice the required time offset, multiplied by the number of echoes per excitation for which data is desired, typically 12–33.

Figure 3:
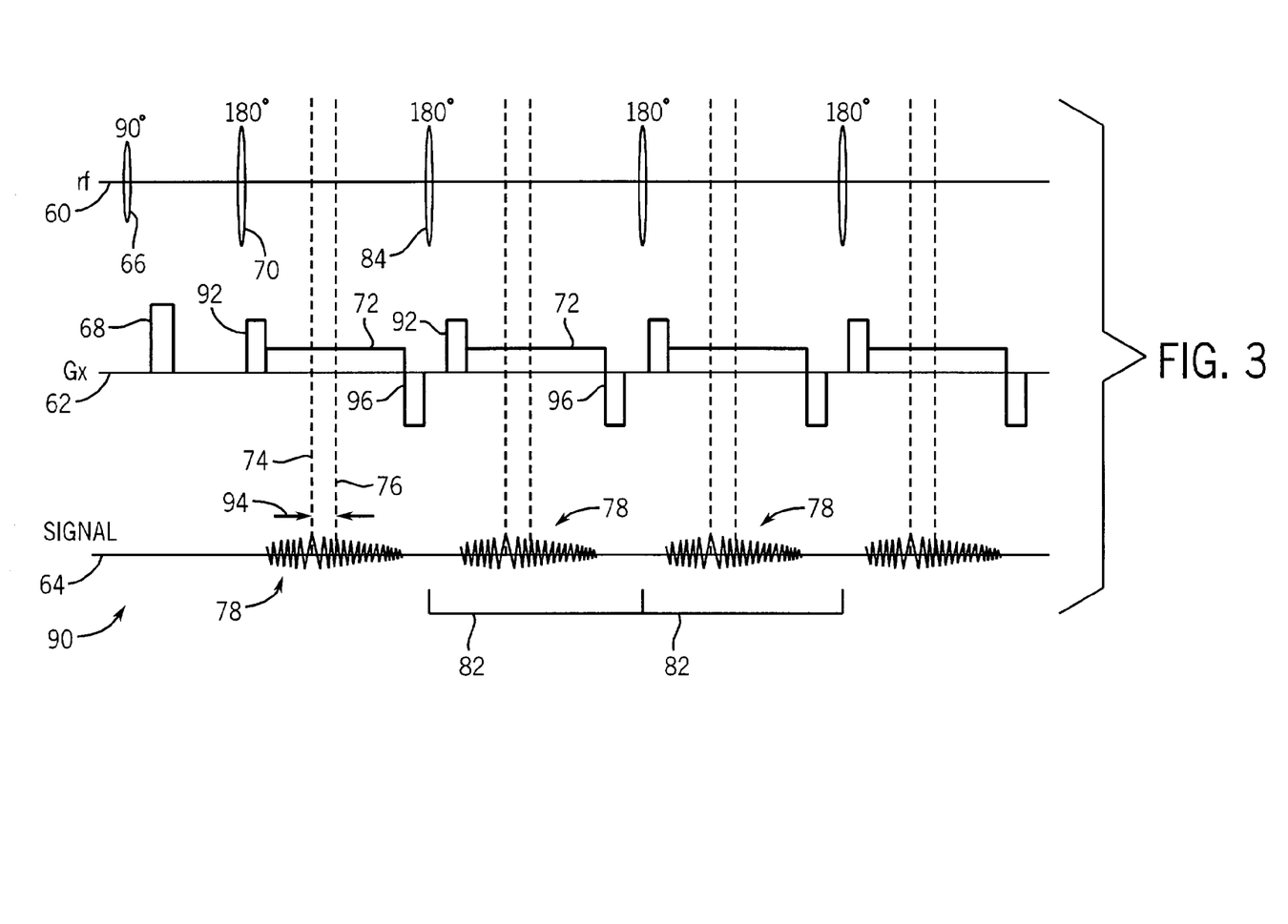
FIG. 3 is a diagrammatical representation of a pulse sequence description in accordance with aspects of the present technique for shifting echo times to reduce the sequential and overall time required for signal acquisition in an MRI sequence of the Dixon fast spin echo type.

FIG. 3 illustrates an improved pulse sequence description for obtaining high-quality Dixon FSE image data, while avoiding the aforementioned added time delay and reducing the image degradation affects. While reference is made herein to an FSE pulse sequence, it should be noted that aspects of the present technique are equally well applicable to other types of imaging, such as spin echo and gradient echo imaging. Moreover, several alternative examples of the pulse sequence description are available for implementing the technique, as described more fully below.

Referring to FIG. 3, the pulse sequence description, which may be referred to as a gradient-induced echo shift sequence 90 is again represented by pulses applied along or occurring along rf axis 60, readout gradient axis 62, and data acquisition axis 64. A first rf axis excitation pulse 66 is applied along the rf axis 60, followed by a dephaser gradient 68 applied along the gradient axis 62. A 180° refocus pulse 70 is then applied along the rf axis 60. In the sequence 90 of FIG. 3, then, a small gradient pulse 92 with minimum duration is added prior to the readout gradient pulse 72. The net effect of the added gradient pulse 92 is to induce a spatially linear spin phase shift along the readout direction, or equivalently a constant time shift in echo position. The time shift may be indicated graphically as indicated at reference numeral 94 in FIG. 3, effectively inducing a desired phase shift between the constituents spin species (e.g. water and fat).

The area of the shifting gradient pulse 92 is set equal to the product of the amplitude of this readout gradient and the desired time shift in echo position. To preserve the Carr-Purcell-Meiboom-Gill (CPMG) condition, another gradient pulse, which may be referred to as a compensating pulse 96 having the same area but opposite polarity is added to the sequence after the readout gradient 72. As will be appreciated by those skilled in the art, the shifting gradient pulse 92 and compensating pulse 96 may be applied during times when slice crusher gradients and phase encode gradients are applied along other logical axes. Thus, no timing change in rf, readout gradient, or data acquisition window locations is necessary. It should also be noted that similar gradient-induced echo shifting gradient pulses 92 are applied during subsequent acquisition repetitions, along with compensating gradient pulses 96. As will be appreciated by those skilled in the art, each refocus fills one line of k-space, or unprocessed data which will be processed and transformed for image reconstruction. The data acquisition, of course, proceeds through acquisition repetitions with varying pre-selected phase shifts (for example, 0, 90 and 180 degrees) that are interleaved with one another. The number of lines of k-space so filled will depend upon the desired image resolution, with 256 lines typically being filled during an examination.

In a present implementation, the spatially linear phase shift along the readout direction induced by the added gradients is effectively restored by re-centering the acquired data before image reconstruction. Consequently, neither increase in the echo spacing nor loss in slice coverage is anticipated. It should be further noted that in the implementation of FIG. 3, an arbitrary echo shift can be effected simply by changing the areas of the gradient pulses 92 and 96 without changing the timing of any other pulses in the sequence. Indeed, with a fixed pulse width for pulses 92 and 96, echo shift is directly proportional to, and conveniently controlled by the amplitude of the gradient pulses themselves.

Figure 4:
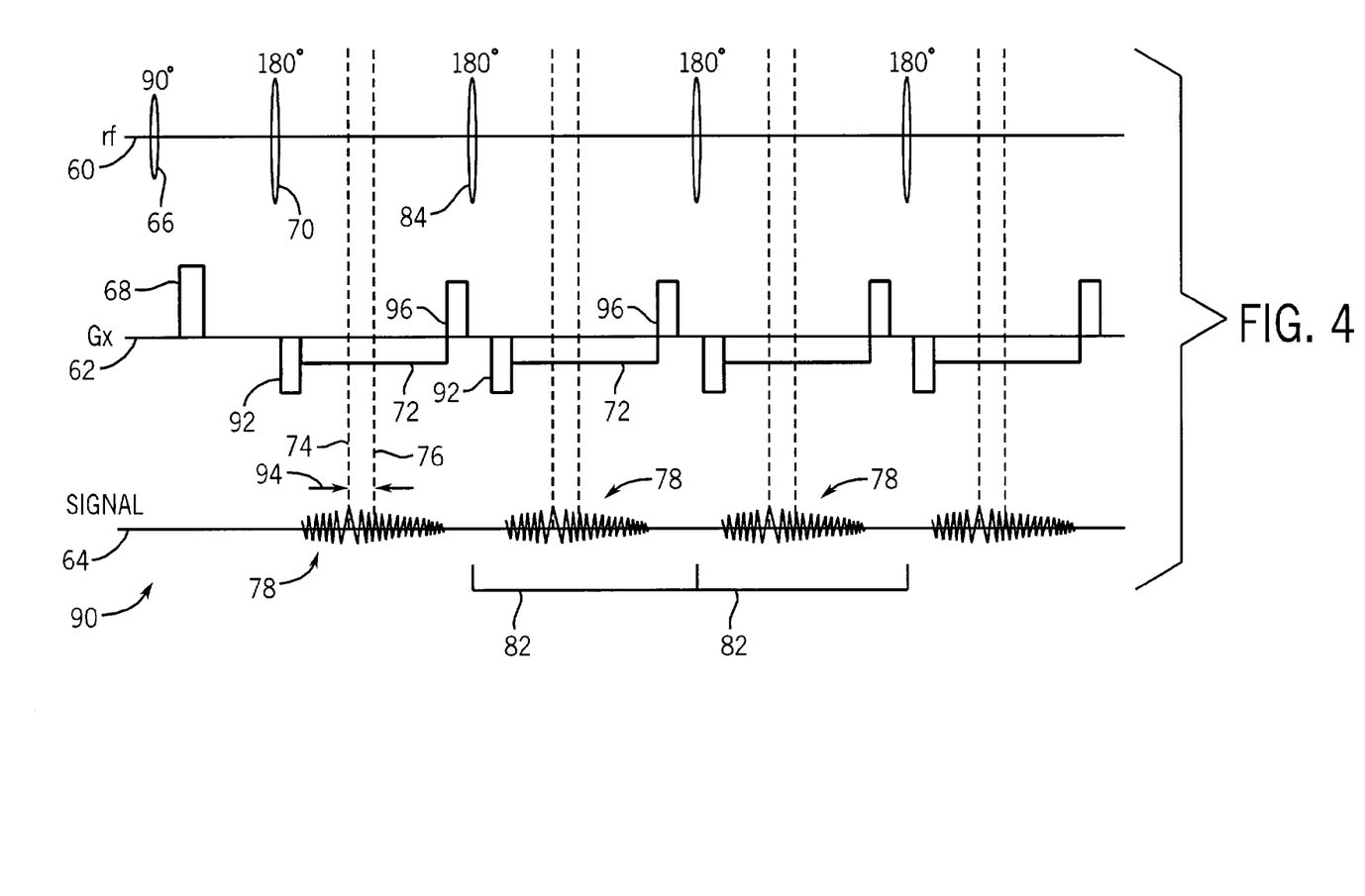
FIG. 4 is a diagrammatical representation of a pulse sequence description similar to that of FIG. 3 but wherein echo shifting gradient pulses have been inverted in polarity.

FIG. 4 represents a variation of the pulse sequence illustrated in FIG. 3. As will be noted in FIG. 4, the polarity of the echo shift pulse gradients 92 and of the compensating gradient 96 may be inverted, while their mutually opposite polarity is maintained. Other aspects of the sequence of FIG. 4 are identical of FIG. 3.

Although the proposed pulse sequence is compatible with various multi-point Dixon acquisition techniques, a three-point asymmetric sampling scheme with 0, 90° and 180° phase shifts was implemented in a present exemplary embodiment. Apart from increasing timing flexibility, the asymmetric sampling has been shown to offer increased processing reliability. To restore the spatially linear phase shift induced by the added gradients, echoes with non-zero phase shifts are first re-centered by an amount equal to the echo shifts induced by the shifting gradient pulses 92 prior to image reconstruction. As a result, the raw data for these echoes are symmetric with a missing portion that is proportional to the phase shifts between the desired water and fat magnetizations in the present exemplary embodiment. In the present exemplary embodiment, a homodyne reconstruction algorithm was used, but with image phase information being preserved by first performing a Fourier transform in accordance with the relationship:

$$I(x, y) = \mathcal{F}^{-1}\{L(k_x, k_y) + 2u(k_x)H(k_x, k_y)\} \qquad \text{Eq. 1}$$
$$= m(x, y)e^{i\phi(x,y)} + h(x, y)e^{i\phi(x,y)} * \frac{1}{i\pi x}$$

where, $L(k_x, k_y)$ and $H(k_x, k_y)$ represent the central symmetric and outer asymmetric portions of the acquired data, respectively. The term $u(k_x)$ is a unit step function that is used to effectively double the weight of the asymmetric portion of the data in the Fourier transform. The term $\Phi(x,y)$ is the spatially varying phase error that arises from factors such as the gradient timing and RF imperfections. The terms $m(x,y)$ and $h(x,y)$ are the desired and the high-resolution components of the image, respectively. The relationship is valid so long as $\phi(x,y)$ can depict adequately the phase of the images reconstructed either using the full or only the central portions of the k-space data. It can be noted that in addition to the desired image $m(x,y)e^{i\Phi(x,y)}$, there is generally a blurring term that is equal to the convolution of $h(x,y)e^{i\Phi(x,y)}$ with a kernel $1/i\pi x$. The contribution of the blurring component is related to the amount of the missing portion of the acquired data. When the phase shift is 0, the acquired echo becomes symmetric and the above relationship is reduced to a conventional Fourier transform.

Because the phase error term $e^{i\Phi(x,y)}$ is usually slow-varying spatially, it can be adequately determined from low-resolution images without compromising the final image resolution. It has been demonstrated that faster and more reliable determination of the phase error terms can be achieved in Dixon processing with low-resolution images because they have reduced matrix size and increased signal-to-noise ratio. In a present implementation, three sets of low-resolution images (corresponding to the acquisitions with 0, 90°, and 180° phase shifts) were reconstructed from the central symmetric portion (either 128×128 or 64×64) of the acquired multipoint Dixon data. A region-growing algorithm without direct phase unwrapping, was employed to determine the phase error term $e^{i\Phi(x,y)}$ from these three low-resolution images corresponding to the different echo shifts.

Assuming $e^{i\Phi(x,y)}$ does not vary significantly over the scale of $1/i\pi x$, it can then be used to demodulate the image from the above computations, in accordance with the relationship:

$$I_s(x, y) = I(x, y)e^{-i\phi(x,y)} \qquad \text{Eq. 2}$$
$$\approx m(x, y) + h(x, y) * \frac{1}{i\pi x}$$

Note that in the regular homodyne reconstruction, both $m(x,y)$ and $h(x,y)$ are assumed to be real, and the blurring component (the second term in Eq. 2 above) can be discarded simply by taking the real part of the sum. In Dixon imaging, it is recognized that this can also be performed when the phase angle difference is either 0 or 180° because the water and fat magnetizations are then along the same axis. For phase angles other than 0 or 180°, the object is generally not real and there is usually an intermix of the blurring component and the desired image in the real and imaginary channels. Under such circumstances, the blurring component can, in principle, be estimated using known approaches, or by iterative methods. In a present implementation, however, because only 36 out of a typical 256 data points were not acquired at 16 kHz receiver bandwidth, simple zero-filling of the data and direct Fourier transform were used to obtain the image corresponding the 90° phase shift.

Figure 5:
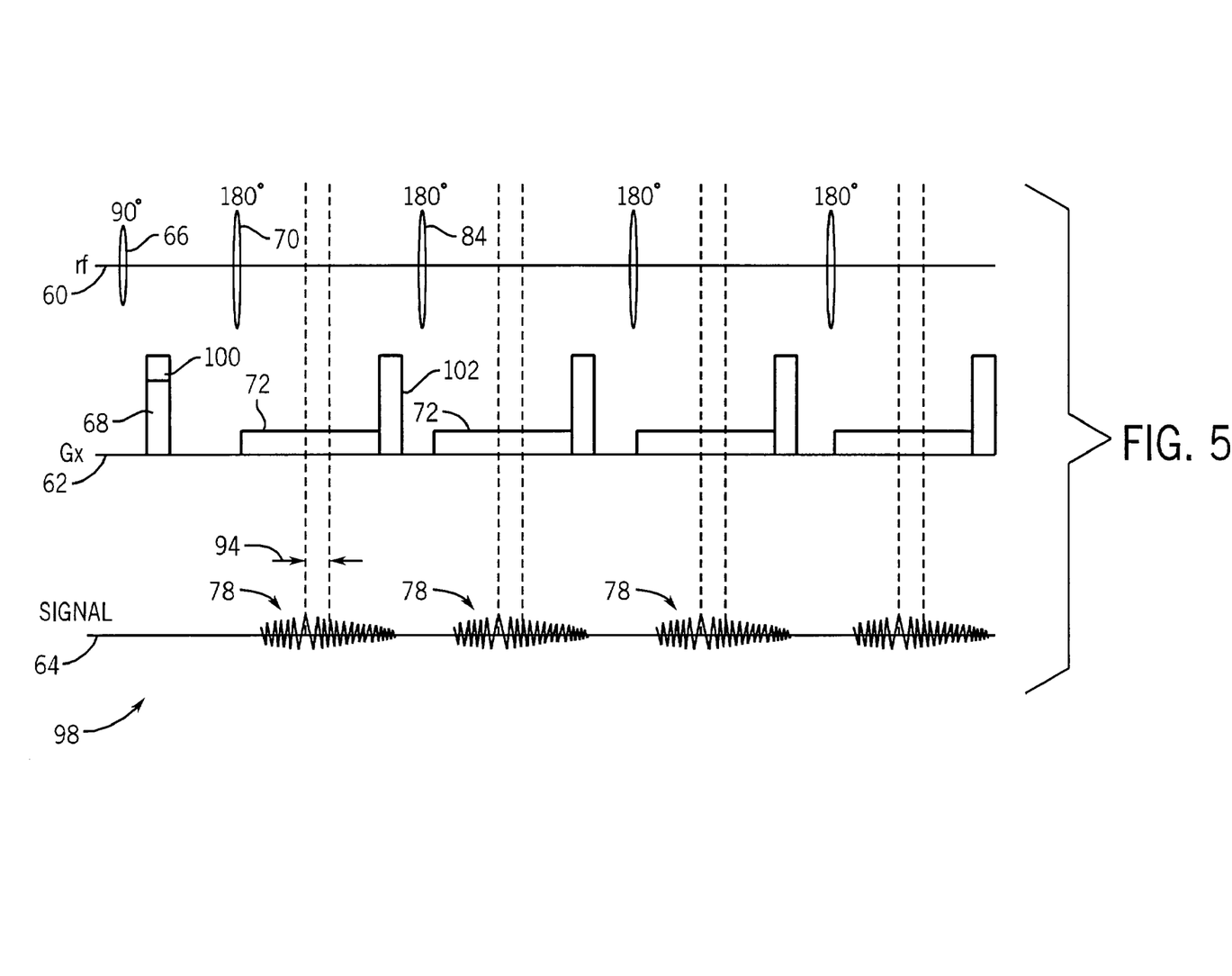
FIG. 5 is diagrammatical representation of an alternative pulse sequence description in accordance with aspects of the present technique.

FIG. 5 represents a further alternative pulse sequence 98 in accordance with aspects of the present technique which can be used to obtain the desired echo shift. As shown in FIG. 5, the pulses applied along the rf axis are essentially similar to those of FIGS. 3 and 4. However, rather than applying the echo shifting gradient pulse 92 prior to the readout pulse 72, an echo shifting gradient pulse 100 is added to the dephaser pulse 68 applied along the readout axis. To compensate for the shift induced by the additional gradient pulse 100, a compensating pulse 102 is applied after the readout pulse 72. Again, the area of the compensating pulse 102 is essentially the same as that of the added pulse portion 100. A similar shift in echo timing is thereby induced as indicated at reference numeral 94. As a variation on the pulse sequence 98 of FIG. 5, the polarity of the shifting of pulse 100 and of the compensating pulse 102 may, as in the previous example, be inverted, thereby altering the manner in which the signal time shift occurs, while maintianing the desired shift.

It should be noted that, due to the assymetrical positioning of the time-shifted MR echo resulting from the gradient pulses 92, not only will one side of the acquired signal be shorter than would be the case without such shifting, the opposite side of the signal will be longer or extended beyond the non-shifted length. Where desired, the additional information provided by the extended portion of the signal may be used to reconstruct images of higher resolution.

It should be noted that aspects of the foregoing techniques may be applied somewhat differently to obtain desired echo shifting in other contexts. For example, other pulse sequences may benefit from the shifting of the MR echo, such as spin echo and gradient echo sequences. In such cases, the negative compensating gradients, while essential for maintaining the CPMG-condition for FSE-based technique, can be left out to further reduce the minimim time required to play out the pulse sequence. In the same spirit, the gradient lobes added for shifting the echo position can possibly be combined with any other gradients on the readout axis if doing so does not change substantively the spin phase accumulation.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims. By way of example, as noted above, the present technique has been described in conjunction with a fast spin echo pulse sequence description. As noted above, however, aspects of the technique may be applied beneficially with other pulse sequence descriptions, such as spin echo imaging sequences. Similarly, while the particular 3-point asymmetric scheme and the particular image reconstruction technique described above has been employed in exemplary embodiments, other schemes and reconstructions techniques may also be used with the improved pulse sequences.

What is claimed is:

1. A method for acquiring magnetic resonance image data comprising:
   in the presence of a primary and gradient magnetic field system, applying a Dixon pulse sequence;
   generating an echo shifting gradient pulse on a readout axis;
   generating a readout gradient pulse on the readout axis;
   detecting magnetic resonance echo signals resulting from the readout gradient; and
   generating a compensating gradient pulse on the readout axis.

2. The method of claim 1, wherein the pulse sequence is a fast spin echo pulse sequence.

3. The method of claim 1, wherein the echo shifting gradient pulse produces a spatially linear spin phase shift along a readout direction.

4. The method of claim 1, wherein the echo shifting gradient pulse produces a constant time shift in a position of the echo signals.

5. The method of claim 4, wherein the area of the echo shifting gradient pulse is substantially equal to the product of an amplitude of the readout gradient and a desired time shift in echo signal position.

6. The method of claim 1, wherein the compensating gradient pulse has a polarity opposite a polarity of the echo shifting gradient pulse.

7. The method of claim 1, wherein the echo shifting gradient pulse is generated during a slice crusher gradient pulse.

8. The method of claim 1, wherein the echo shifting gradient pulse is generated during a phase encode gradient pulse.

9. The method of claim 1, comprising repeating the steps for a series of k-space acquisition lines.

10. The method of claim 1, further comprising reconstructing an image based upon the detected echo signals in accordance with a phase sensitive partial Fourier reconstruction algorithm.

11. The method of claim 10, comprising re-centering echo signal data prior to image reconstruction.

12. The method of claim 10, comprising reconstructing a water-only image.

13. The method of claim 10, comprising reconstructing a fat-only image.

14. A method for acquiring magnetic resonance image data comprising:
   in the presence of a primary and gradient magnetic field system, applying a Dixon fast spin echo pulse sequence;
   generating an echo shifting gradient pulse on a readout axis;
   generating a readout gradient pulse on the readout axis;
   detecting magnetic resonance echo signals resulting from the readout gradient; and
   generating a compensating gradient pulse on the readout axis.

15. The method of claim 14, wherein the echo shifting gradient pulse produces a spatially linear spin phase shift along a readout direction.

16. The method of claim 14, wherein the echo shifting gradient pulse produces a constant time shift in a position of the echo signals.

17. The method of claim 16, wherein the area of the echo shifting gradient pulse is substantially equal to the product of an amplitude of the readout gradient and a desired time shift in echo signal position.

18. The method of claim 14, wherein the compensating gradient pulse has a polarity opposite a polarity of the echo shifting gradient pulse.

19. The method of claim 14, wherein the echo shifting gradient pulse is generated during a slice crusher gradient pulse.

20. The method of claim 14, wherein the echo shifting gradient pulse is generated during a phase encode gradient pulse.

21. The method of claim 14, comprising repeating the steps for a series of k-space acquisition lines.

22. The method of claim 14, further comprising reconstructing an image based upon the detected echo signals in accordance with a phase sensitive partial Fourier reconstruction algorithm.

23. The method of claim 22, comprising re-centering echo signal data prior to image reconstruction.

24. The method of claim 22, comprising reconstructing a water-only image.

25. The method of claim 24, comprising reconstructing a fat-only image.

26. A method for acquiring magnetic resonance image data comprising:
  in the presence of a primary and gradient magnetic field system, applying a Dixon fast spin echo pulse sequence to acquire a plurality of k-space lines of data;
  for each k-space line of data:
  generating an echo shifting gradient pulse of a first polarity and of a desired area on a readout axis;
  generating a readout gradient pulse on the readout axis;
  detecting magnetic resonance echo signals resulting from the readout gradient; and
  generating a compensating gradient pulse of a second polarity opposite to the first polarity and of the desired area on the readout axis.

27. The method of claim 26, wherein each echo shifting gradient pulse produces a spatially linear spin phase shift along a readout direction.

28. The method of claim 26, wherein each echo shifting gradient pulse produces a constant time shift in a position of the echo signals.

29. The method of claim 26, wherein the desired area of the echo shifting gradient pulse is substantially equal to the product of an amplitude of the readout gradient and a desired time shift in the echo signal position.

30. The method of claim 26, wherein each echo shifting gradient pulse is generated during a slice crusher gradient pulse.

31. The method of claim 26, wherein each echo shifting gradient pulse is generated during a phase encode gradient pulse.

32. The method of claim 26, further comprising reconstructing an image based upon the detected echo signals in accordance with a phase sensitive partial Fourier reconstruction algorithm.

33. The method of claim 32, comprising re-centering the detected signal data prior to image reconstruction.

34. The method of claim 32, comprising reconstructing a water-only image.

35. The method of claim 32, comprising reconstructing a fat-only image.

36. A method for acquiring magnetic resonance image data comprising:
  in the presence of a primary and gradient magnetic field system, applying a Dixon fast spin echo pulse sequence to acquire a plurality of k-space lines of data;
  for each k-space line of data:
  generating an echo shifting gradient pulse of a first polarity and of a desired area on a readout axis;
  generating a readout gradient pulse on the readout axis;
  detecting magnetic resonance echo signals resulting from the readout gradient;
  generating a compensating gradient pulse of a second polarity opposite to the first polarity and of the desired area on the readout axis; and
  reconstructing an image based upon the detected echo signals in accordance with a phase sensitive partial Fourier reconstruction algorithm.

37. The method of claim 36, wherein each echo shifting gradient pulse produces a spatially linear spin phase shift along a readout direction.

38. The method of claim 36, wherein each echo shifting gradient pulse produces a constant time shift in a position of the echo signals.

39. The method of claim 36, wherein the desired area of the echo shifting gradient pulse is substantially equal to the product of an amplitude of the readout gradient and a desired time shift in the echo signal position.

40. The method of claim 36, wherein each echo shifting gradient pulse is generated during a slice crusher gradient pulse.

41. The method of claim 36, wherein each echo shifting gradient pulse is generated during a phase encode gradient pulse.

42. The method of claim 36, comprising re-centering the detected signal data prior to image reconstruction.

43. The method of claim 36, comprising reconstructing a water-only image.

44. The method of claim 36, comprising reconstructing a fat-only image.

45. An image generated by the method of claim 36.

46. A magnetic resonance imaging system comprising:
  means for applying a Dixon fast spin echo pulse sequence to acquire a plurality of k-space lines of data;
  means for generating an echo shifting gradient pulse of a first polarity and of a desired area on a readout axis;
  means for generating a readout gradient pulse on the readout axis;
  means for detecting magnetic resonance echo signals resulting from the readout gradient;
  means for generating a compensating gradient pulse of a second polarity opposite to the first polarity and of the desired area on the readout axis; and
  means for reconstructing an image based upon the detected echo signals.

* * * * *